(12) United States Patent
Aleksov et al.

(10) Patent No.: US 11,804,455 B1
(45) Date of Patent: Oct. 31, 2023

(54) SUBSTRATE INTEGRATED THIN FILM CAPACITORS USING AMORPHOUS HIGH-K DIELECTRICS

(71) Applicant: Intel Corporation, Santa Clara, CA (US)

(72) Inventors: Aleksandar Aleksov, Chandler, AZ (US); Thomas Sounart, Chandler, AZ (US); Kristof Darmawikarta, Chandler, AZ (US); Henning Braunisch, Phoenix, AZ (US); Prithwish Chatterjee, Tempe, AZ (US); Andrew J. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/960,057

(22) Filed: Oct. 4, 2022

Related U.S. Application Data

(63) Continuation of application No. 16/024,702, filed on Jun. 29, 2018, now Pat. No. 11,495,552.

(51) Int. Cl.
*H01L 23/64* (2006.01)
*H01L 23/498* (2006.01)
*H01L 21/48* (2006.01)
*H01L 23/00* (2006.01)

(52) U.S. Cl.
CPC ........ *H01L 23/642* (2013.01); *H01L 21/4846* (2013.01); *H01L 23/49827* (2013.01); *H01L 23/49838* (2013.01); *H01L 23/49894* (2013.01); *H01L 24/16* (2013.01); *H01L 2224/16225* (2013.01); *H01L 2224/16265* (2013.01); *H01L 2924/19041* (2013.01); *H01L 2924/19103* (2013.01)

(58) Field of Classification Search
CPC ...................................................... H01L 23/642
See application file for complete search history.

(56) References Cited

U.S. PATENT DOCUMENTS 5,874,770 A * 2/1999 Saia .................. H01L 23/49822
257/532
7,186,625 B2 * 3/2007 Chudzik ................. H01L 28/91
438/386
2003/0124794 A1 7/2003 Girardie

OTHER PUBLICATIONS

Jong-Hyun Park et al. "Bismuth-Zinc-Niobate embedded capacitors grown at room temperature for printed circuit board applications," Applied Physics Letters 88, America Institute of Physics, May 9, 2006, 4 pgs.

(Continued)

*Primary Examiner* — William A Harriston
(74) *Attorney, Agent, or Firm* — Schwabe, Williamson & Wyatt, P.C.

(57) ABSTRACT

Embodiments include an electronic package that includes a dielectric layer and a capacitor on the dielectric layer. In an embodiment, the capacitor comprises a first electrode disposed over the dielectric layer and a capacitor dielectric layer over the first electrode. In an embodiment, the capacitor dielectric layer is an amorphous dielectric layer. In an embodiment, the electronic package may also comprise a second electrode over the capacitor dielectric layer.

25 Claims, 13 Drawing Sheets

(56) References Cited

OTHER PUBLICATIONS

Zhang et al., "Preparation and electrical properties of Bi2Zn2/3Nb4/3O7 thin films deposited at room temperature for embedded capacitor applications," Ceramics International 38S, Apr. 4, 2011, 5 pages.
Seung Eun Lee et al. "Dielectric Properties of PCB Embedded Bismuth-Zinc-Niobate Films Prepared by RF Magnetron Sputtering," 10th Electronics Packaging Technology Conference, 2008, 4 pages.

* cited by examiner

SUBSTRATE INTEGRATED THIN FILM CAPACITORS USING AMORPHOUS HIGH-K DIELECTRICS

CROSS-REFERENCE TO RELATED APPLICATIONS

This application is a continuation of U.S. patent application Ser. No. 16/024,702, filed on Jun. 29, 2018, the entire contents of which is hereby incorporated by reference herein.

TECHNICAL FIELD

Embodiments of the present disclosure relate to electronics packaging, and more particularly, to thin film capacitors that are fabricated in the packaging substrate. In an embodiment, the thin film capacitors are fabricated with amorphous high-k dielectric materials.

BACKGROUND

First droop and power delivery (PD) noise are roadblocks as processors continue to pull more power. First droop is caused by the active circuitry inside the die beginning to pull power. Current solutions for improving first droop involve adding capacitance to the circuits that provide power to the die. Adding capacitors that are proximate to the die (i.e., to the origin of the droop) is preferable. Adding capacitance proximate to the die also decreases any inductive components of the impedance that are usually present due to the routing that connects the capacitance to the die. To efficiently improve first droop by increasing the PD capacitance, the capacitors need to be placed as close to the die as possible or even within the die itself.

Currently, metal insulator metal (MIM) capacitors are integrated into the back end of the die to improve first droop. However, adding additional MIM capacitors in the back end is not without issue. As power continues to scale, the use of additional MIM capacitors in the back end of the die is not a practical option.

Additional first droop solutions may include the use of land-side capacitors (LSCs). LSCs are surface mounted discrete components with high inductance contacts. Furthermore, the electrical path from the LSCs to the die is relatively long. This adds parasitic inductance, and the benefits of the LSCs are significantly reduced. Due to the location of the LSCs, the LSCs also interfere with the package/board interface.

A third option for improving first droop is by using ultra-high-k materials such as PZT and $BaTiO_3$. However, ultra-high-k materials require high-temperature anneals (e.g., 500° C. or greater) to form the proper crystal structures that provide the high-k characteristic of such materials. Reaching such high temperatures to allow for proper crystallization is not possible with organic build-up materials, and therefore, requires the use of laser annealing. The inclusion of laser annealing is disruptive to currently used high volume manufacturing processes, and is therefore not an ideal option. Furthermore, such ultra-high-k materials require a thickness (e.g., 100 nm or greater) that supports crystal growth. Accordingly, the form-factor of packages that use such films is limited.

It has been proposed that prefabricated films that comprise high-k dielectric films laminated between conductors may be used to integrate capacitors into the build-up layers of a package substrate. However, existing films (e.g., metal/$BaTiO_3$/metal films) have thicknesses that exceed the thickness of a typical build-up layer thickness. For example, existing films have a thickness that is 50 μm thick or greater. This increases the manufacturing complexity and increases the Z-height of the package. The use of prefabricated capacitor films also increases the cost of the package since such films need to be purchased from suppliers.

EMBODIMENTS OF THE PRESENT DISCLOSURE

Described in embodiments herein are electronic packages with thin film capacitors that use amorphous high-k dielectrics and methods of forming such thin film capacitors in the electronic package. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order not to obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

As noted above, the existing solutions to minimizing first droop each have significant drawbacks. Accordingly, embodiments described herein include thin film capacitors that are formed with amorphous high-k dielectric films. Amorphous high-k dielectric films allow for integration with the build-up films using high volume manufacturing compatible processes. Furthermore, since the amorphous high-k dielectric films do not rely on a defined crystal structure for their high-k characteristics, the amorphous high-k dielectric films do not require high-temperature annealing, and may have a minimal thickness. For example, the thickness of the amorphous high-k dielectric film may be limited by only the surface roughness of an underlying layer. Embodiments described herein allow for amorphous high-k dielectric films that have a thickness less than 50 nm. Accordingly, the form factor of a package substrate that utilizes capacitors with amorphous high-k dielectrics is not negatively impacted.

Furthermore, the amorphous high-k dielectric films may be integrated into any layer of a packaging substrate. Accordingly, the capacitors may be formed in the layer of the package substrate closest to the die. The proximity to the die provides maximum benefit in reducing first droop. However, it is to be appreciated that such capacitors may be formed in any layer (or in a plurality of layers) in the package. Furthermore, it is to be appreciated that capacitors that utilize amorphous high-k dielectric layers may also be used for other applications beyond reducing first droop and power delivery applications.

Figure 1A:
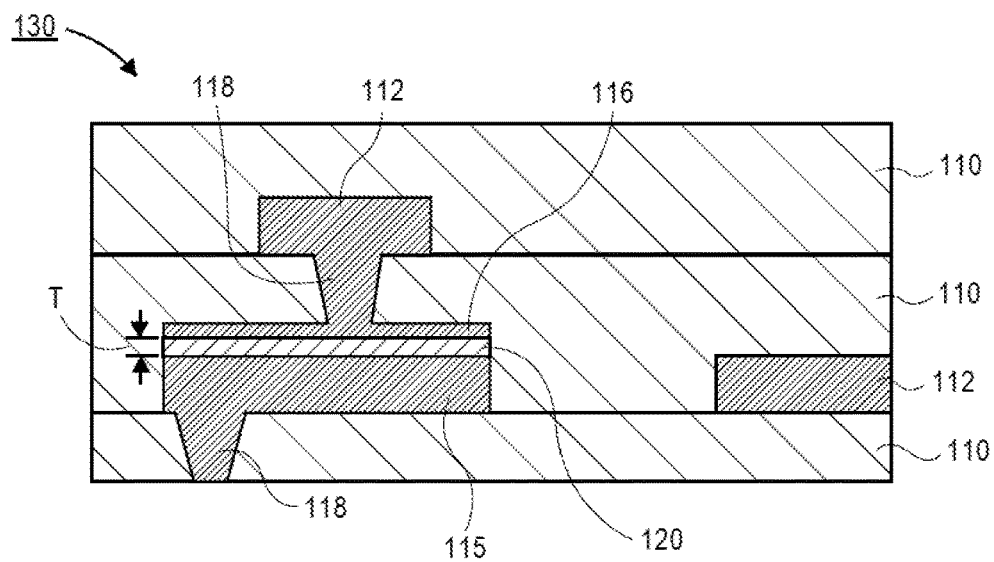
FIG. 1A is a cross-sectional illustration of a thin film capacitor that is fabricated in a dielectric layer, in accordance with an embodiment.

Referring now to FIG. 1A, a cross-sectional illustration of a thin film capacitor 130 is shown, in accordance with an embodiment. In an embodiment, the capacitor 130 may be fabricated in a package substrate that comprises one or more build-up layer dielectrics 110. In an embodiment, conductive traces 112 and vias 118 may be formed in one or more of the build-up layer dielectrics 110, as is known in the art.

In an embodiment, the capacitor may comprise a first electrode 115 and a second electrode 116. In an embodiment, the first electrode 115 may be substantially the same thickness as conductive traces 112 formed in the same build-up layer dielectric 110. However, it is to be appreciated that embodiments may also include a first electrode 115 that is any thickness. In an embodiment, the first electrode 115 and the second electrode 116 may be formed with the same material used to form conductive traces 112 and vias 118 in the build-up layer dielectrics 110. For example, the first electrode 115 and the second electrode 116 may be copper or any other conductive material.

In an embodiment, an amorphous high-k dielectric layer 120 may be disposed between the first electrode 115 and the second electrode 116. As used herein, high-k dielectric films refer to films that have a k-value that is greater than 10. In an embodiment, high-k dielectric films refer to films that have a k-value that is 100 or greater. In an embodiment, high-k dielectric films refer to films that have a k-value that is between 10 and 150. In an embodiment the amorphous high-k dielectric layer 120 may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Furthermore, while the amorphous high-k dielectric layer 120 is shown as a single layer, it is to be appreciated that the amorphous high-k dielectric layer 120 may comprise a stack of two or more layers where at least one of the layers is an amorphous high-k dielectric film.

In an embodiment, the amorphous high-k dielectric film 120 may have a thickness T. The thickness T may be a minimum thickness that provides a uniform and closed film over the underlying layer. In an embodiment, the thickness T may be limited by the surface roughness of the underlying layer (e.g., the first electrode 115). In an embodiment, the thickness T may also be limited by a breakdown voltage of the amorphous high-k dielectric film 120. In an embodiment, the thickness T may be limited by an acceptable leakage of the high-k dielectric film 120. For example, the thickness T may be 5 μm or less. In an embodiment, the thickness T may be 2 μm or less. In an embodiment, the thickness T may be 50 nm or less.

In an embodiment, the capacitors 130 may have any suitable shape and dimension, and are only limited by the lithography processes used to form the capacitors 130. For example, the capacitors 130 may have substantially rectangular or circular shapes. In an embodiment, the area of each capacitor 130 may be between 100 μm$^2$ and 750 μm$^2$. In an embodiment, the smallest side length (or diameter) of each capacitor may be approximately 10 μm or less, or 5 μm or less. In some embodiments, the dimensions of the capacitor 130 may be set by the pitch of the die bump field. For example, the capacitor 130 may be substantially square with a side length of 175 μm, or the capacitor 130 may be circular with a diameter of 200 μm. However, it is to be appreciated that the capacitor 130 may also group and/or bridge more than one bump that is part of the power delivery network of the die. In such embodiments, an individual capacitor 130 may have an area that is significantly greater than 750 μm$^2$. For example, the capacitor 130 may have an area that is 1 mm$^2$ or greater or even 2 mm$^2$ or greater. Larger capacitors 130 that span multiple bumps are feasible since the operating frequency of power delivery networks are relatively low (e.g., 100 MHz). However, it is to be appreciated that high switching frequencies are also capable by using a plurality of smaller parallel capacitors (e.g., where each capacitor 130 has an area less than approximately 50,000 μm$^2$). In an embodiment, the capacitive density of the capacitor 130 may be between approximately 10 nF/mm$^2$ and 100 nF/mm$^2$.

Figure 1B:
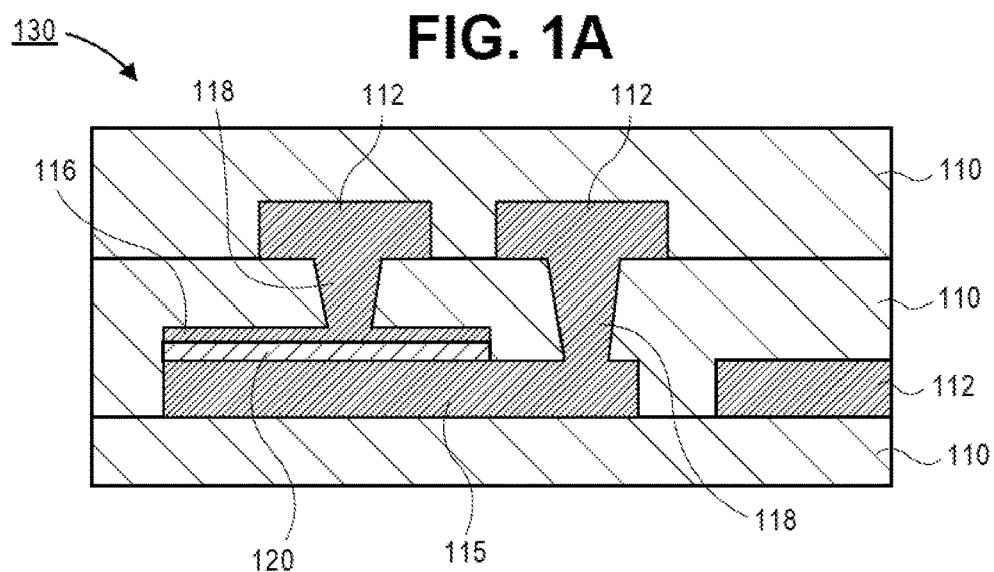
FIG. 1B is a cross-sectional illustration of a thin film capacitor that is fabricated in a dielectric layer, in accordance with an additional embodiment.

In an embodiment, an electrical connection to the first electrode 115 may be made by a via 118 that connects to a bottom surface of the first electrode 115, and an electrical connection to the second electrode 116 may be made by a via 118 that connects to a top surface of the second electrode 116. However, it is to be appreciated that embodiments are not limited to such configurations. For example, in FIG. 1B, an electrical connection to the first electrode 115 may be made by a via that connects to a top surface of the first electrode. However, it is to be appreciated that electrical connections to the electrodes of the capacitor 130 may be made with any configuration of vias and/or traces depending on the design of the device.

Figure 1C:
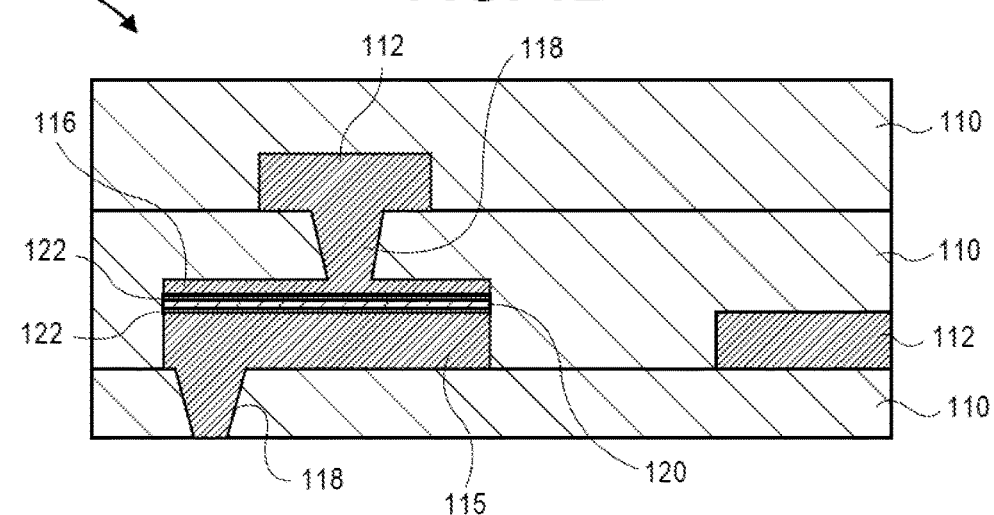
FIG. 1C is a cross-sectional illustration of a thin film capacitor that is fabricated in a dielectric layer, in accordance with an additional embodiment.

Referring now to FIG. 1C, a cross-sectional illustration of a capacitor is shown, in accordance with an additional embodiment. The capacitor 130 in FIG. 1C is substantially similar to the capacitor 130 illustrated in FIG. 1A, with the exception that the amorphous high-k dielectric layer 120 is separated from the first electrode 115 and the second electrode 116 by intermediate metal layers 122. The intermediate metal layers 122 may function as a barrier layer that minimizes diffusion and/or reduces leakage. In an embodiment, the intermediate metal layers 122 may also be formed of a material that allows for improved performance of the amorphous high-k dielectric layer 120. For example, when the amorphous high-k dielectric layer 120 is TiO$_3$ or tantalum (pent)oxide, the intermediate metal layers 122 may comprise titanium. In a particular embodiment, the intermediate metal layers 122 may comprise titanium that is doped with nitrogen. While titanium is provide as an example of the intermediate metal layer 122, it is to be appreciated that any conductive material may be used in other embodiments described herein.

Figure 2:
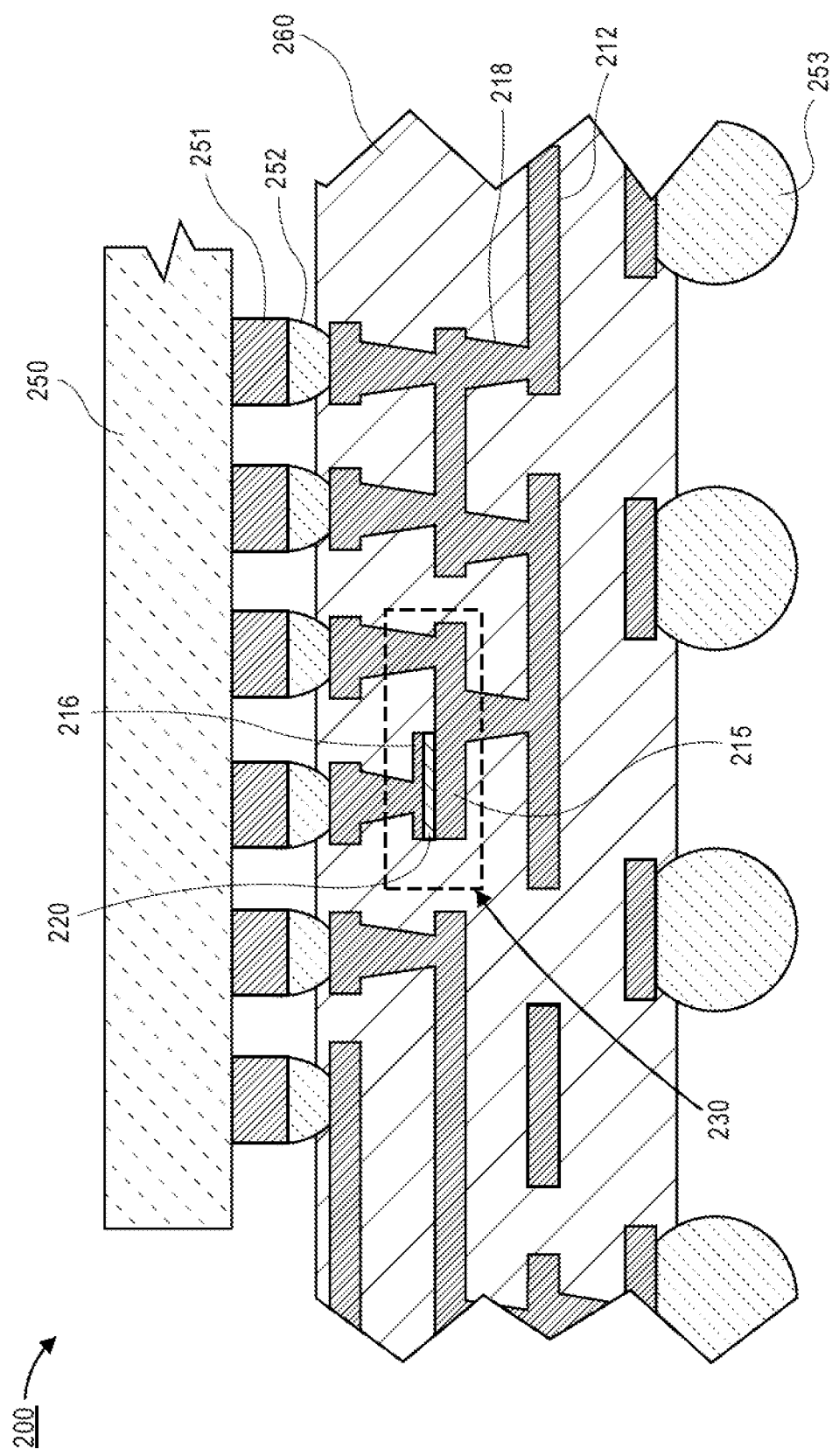
FIG. 2 is a cross-sectional illustration of a coreless electronic package that comprises a thin film capacitor that is fabricated in a layer of the package substrate, in accordance with an embodiment.

Referring now to FIG. 2, a cross-sectional illustration of an electronics package 200 is shown, in accordance with an embodiment. In an embodiment, the electronics package 200 may comprise a die 250 that is electrically and mechanically coupled to a coreless package substrate 260 by bumps 251 and solder balls 252. In an embodiment, the package substrate 260 may further comprise solder balls 253 to provide electrical and mechanical coupling to a board (e.g., a printed circuit board (PCB). However, it is to be appreciated that any suitable interconnect may be used, such as metal lands in a land grid array (LGA) package, pins in a pin grid array (PGA) package, or the like. In an embodiment, the package substrate 260 may comprise a plurality of layers of conductive traces 212. The conductive traces 212 on different layers of the package substrate 260 may be electrically coupled together by vias 218.

In an embodiment, package substrate 260 may comprise one or more thin film capacitors 230. For example, the thin film capacitors 230 may be substantially similar to capacitors such as those described in greater detail herein. In an embodiment, the thin film capacitor 230 may comprise a first electrode 215, a second electrode 216, and an amorphous high-k dielectric layer 220 formed between the first electrode 215 and the second electrode 216.

In an embodiment, the thin film capacitor 230 may be positioned below the die 250. In the illustrated embodiment, the thin film capacitor 230 may be positioned in a layer of the package substrate 260 that is proximate to the die 250. For example, the capacitor 230 illustrated in FIG. 2 is shown as being in the second layer of the package substrate 260. However, it is to be appreciated that the capacitor 230 may be located in any layer of the package substrate 260, including the first layer of the package substrate. Furthermore, while the capacitor 230 is illustrated as being below the die 250, embodiments are not limited to such configurations, and the capacitor 230 may be located at any position in the package substrate 230.

Figure 3:
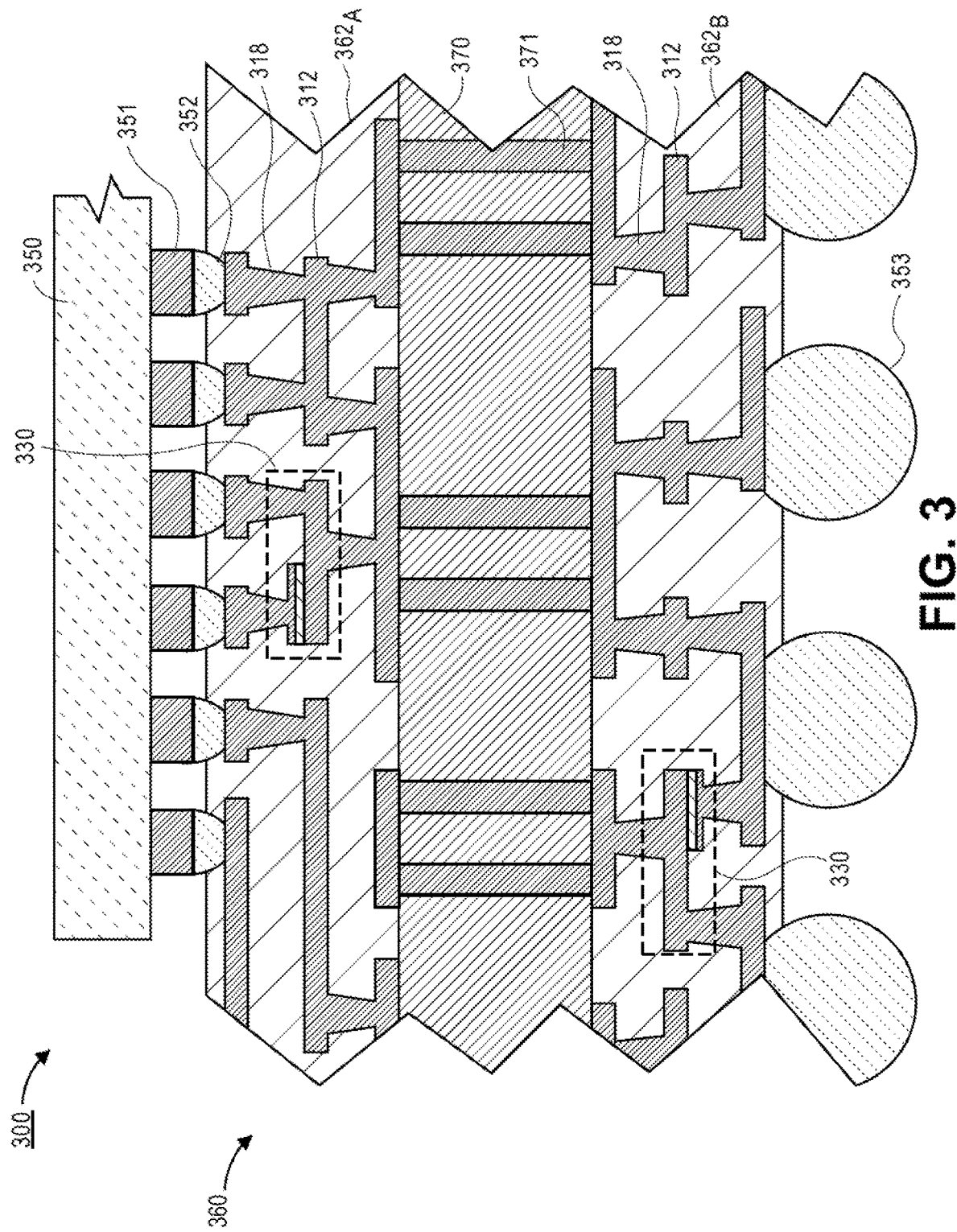
FIG. 3 is a cross-sectional illustration of an electronic package with a core that includes thin film capacitors in the build-up layers over the core, in accordance with an embodiment.

Referring now to FIG. 3, an electronics package 300 is shown, in accordance with an embodiment. Electronics package 300 may be substantially similar to electronics package 200 described with respect to FIG. 2 with the exception that the package substrate 360 is a cored substrate. Accordingly, the package substrate 360 may comprise first build-up layers 362$_A$ and second build-up layers 362$_B$ that are formed on opposing surfaces of a core 370. The conductive traces 312 in the first build-up layers 362$_A$ may be electrically coupled to the conductive traces 312 in the second build-up layers 362$_B$ by through-hole vias 371 formed through the core 370.

In an embodiment, the electronics package 300 may comprise one or more capacitors 330 formed in one or both of the first build-up layers 362$_A$ and the second build-up layers 362$_B$. In an embodiment, the capacitors 330 may be formed in any layer of the first build-up layers 362$_A$ and the second build-up layers 362$_B$.

Figure 4:
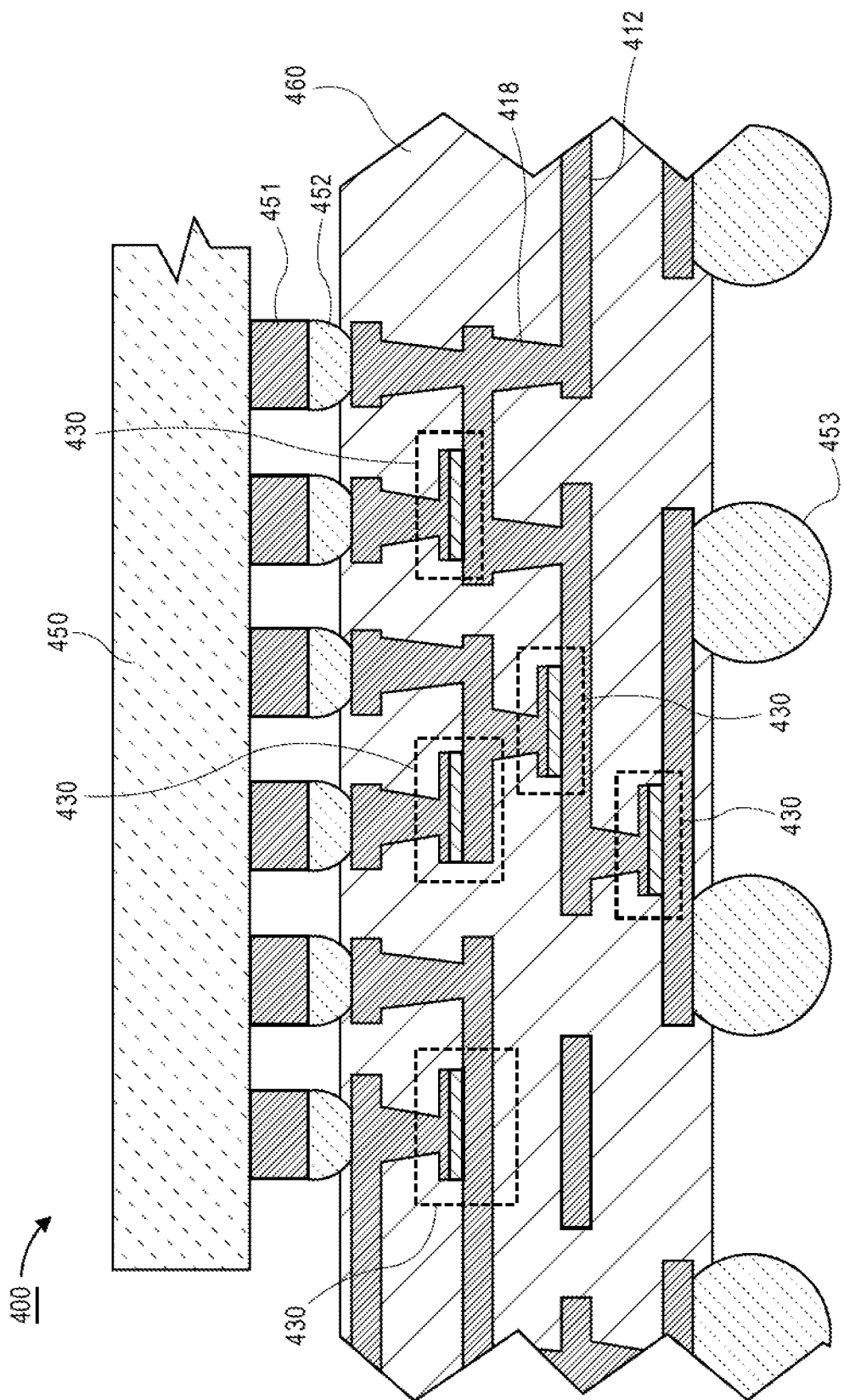
FIG. 4 is a cross-sectional illustration of a coreless electronic package that comprises a plurality of thin film capacitors in more than one layer of the electronic package, in accordance with an embodiment.

Referring now to FIG. 4, a cross-sectional illustration of an electronics package 400 is shown, in accordance with an embodiment. The electronics package 400 is substantially similar to the electronics package 200 described with respect to FIG. 2, with the exception that there are a plurality of capacitors 430 formed in the package substrate 460. In the illustrated embodiment, there are five capacitors 430 shown, however, it is to be appreciated that any number of capacitors 430 may be formed in the package substrate 460. For example, tens, hundreds, or thousands of capacitors 430 may be fabricated in the package substrate 460. In an embodiment, the capacitors 430 may be formed in one or more layers of the package substrate.

While thin film capacitors with a single parallel plate configuration are described above with respect to FIGS. 1A-4, it is to be appreciated that embodiments are not limited to such configurations. For example, the thin film capacitors may be fabricated with any number of amorphous high-k dielectric layers, and/or with non-planar configurations. The use of a plurality of stacked high-k dielectric layers and/or non-planar configurations provides even greater capacitance density. Examples of such embodiments are shown in FIGS. 5A-5C.

Figure 5A:
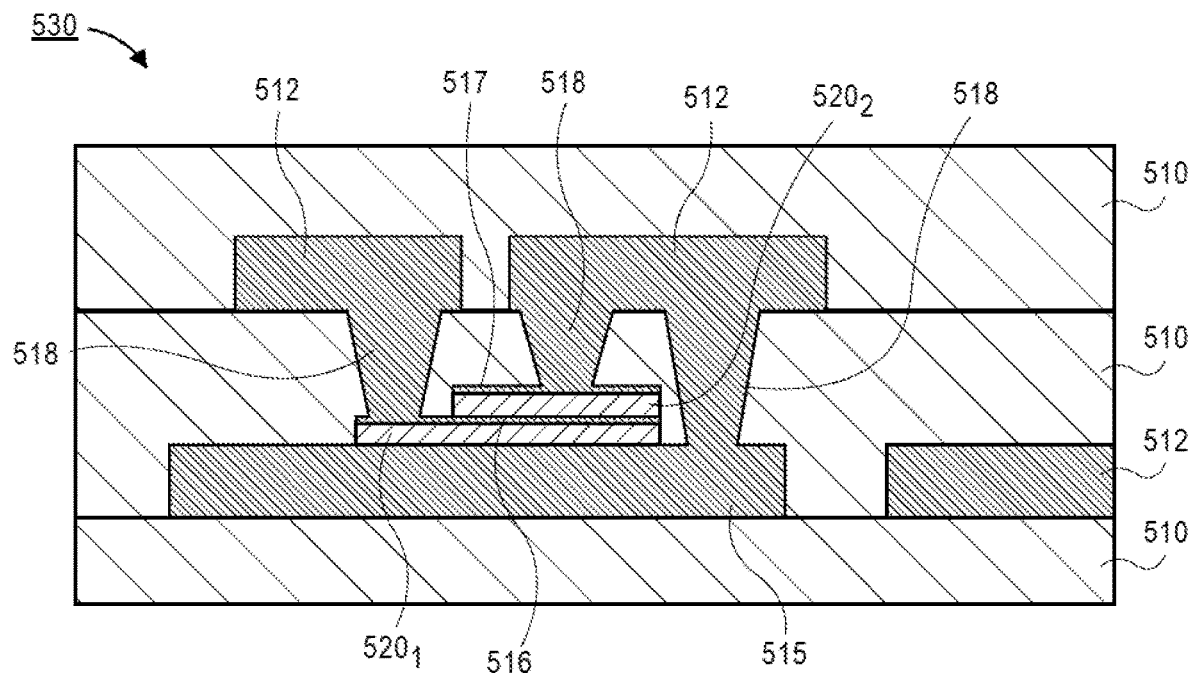
FIG. 5A is a cross-sectional illustration of thin film capacitor with two dielectric layers, in accordance with an embodiment.

Referring now to FIG. 5A, a cross-sectional illustration of a capacitor 530 with a stack of two amorphous high-k dielectric films 520 is shown, in accordance with an embodiment. In an embodiment, a first amorphous high-k dielectric film $520_1$ may be formed over the first electrode 515, and a second electrode 516 may be formed over the first high-k dielectric film $520_1$. In an embodiment, a second amorphous high-k dielectric film $520_2$ may be formed over the second electrode 516. In an embodiment a third electrode 517 may be formed over the second amorphous high-k dielectric film $520_2$. In the illustrated embodiment all of the connections to the electrodes 515-517 are formed to the top surfaces of the electrodes. However, it is to be appreciated that embodiments also include electrical connections to any surface of the electrodes. Additionally, embodiments may also include intermediate metals (similar to those described with respect to FIG. 1C) that separate the amorphous high-k dielectric layers 520 from the electrodes 515-517. Due to the ability to deposit thin amorphous dielectric layers 520, the total thickness of the capacitor 530 may be less than a thickness of a build-up layer dielectric 510. For example, the capacitor 530 may have a thickness less than 15 μm, less than 10 μm, or less than 5 μm.

Figure 5B:
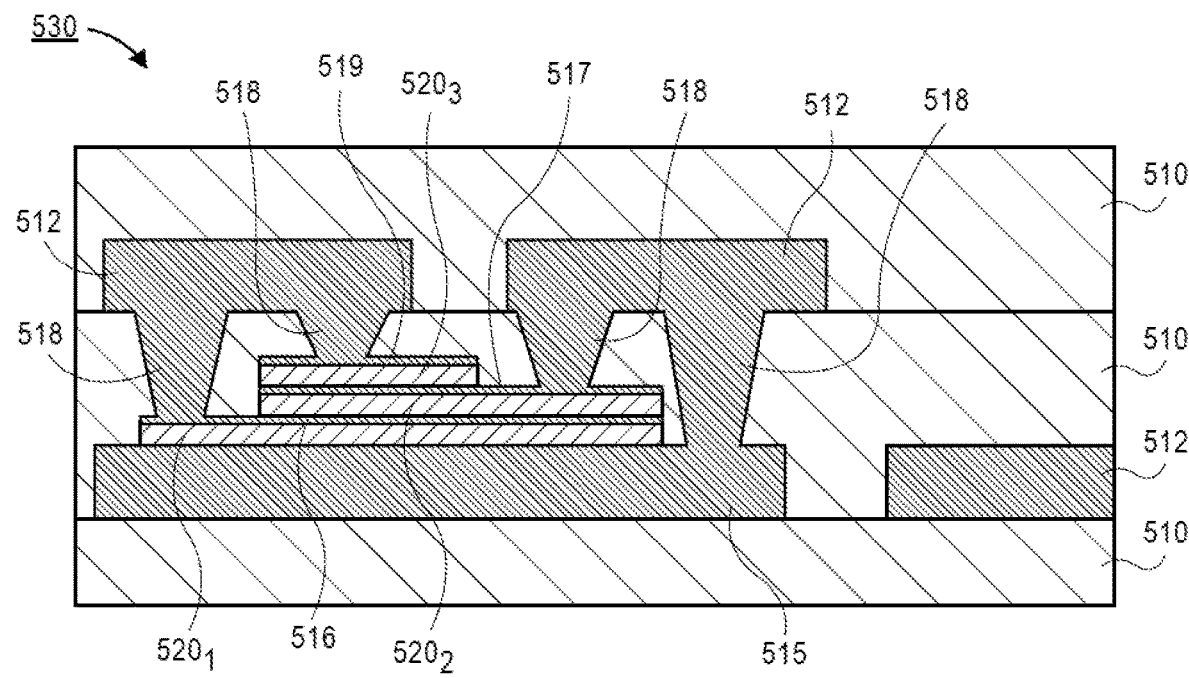
FIG. 5B is a cross-sectional illustration of a thin film capacitor with a plurality of dielectric layers, in accordance with an embodiment.

Referring now to FIG. 5B, a cross-sectional illustration of a capacitor 530 is shown, in accordance with an additional embodiment. The capacitor 530 is substantially similar to capacitor 530 described with respect to FIG. 5A, with the exception that a third amorphous high-k dielectric layer $520_3$ is formed. In an embodiment, the third amorphous high-k dielectric layer $520_3$ may be formed over the third electrode 517. In an embodiment, a fourth electrode 519 may be formed over the third amorphous high-k dielectric layer $520_3$. While three amorphous dielectric layers are illustrated, it is to be appreciated that a capacitor 530 may comprise any number of stacked amorphous high-k dielectric layers 520 in order to provide a desired capacitance density. In the illustrated embodiments, each of the amorphous dielectric layers 520 of the capacitor are illustrated as being formed in a single build-up layer dielectric 510. However, embodiments are not limited to such configurations. For example, capacitors 530 may comprise amorphous dielectric layers 520 that are formed in more than one build-up layer.

Figure 5C:
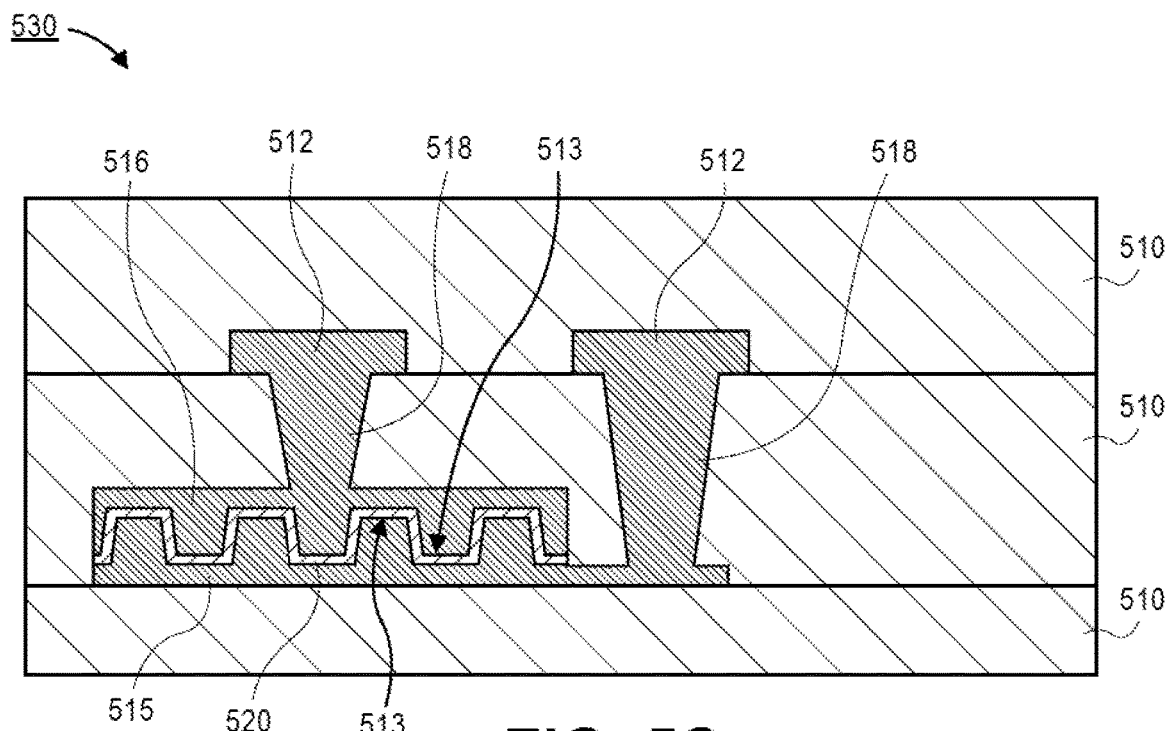
FIG. 5C is a cross-sectional illustration of a thin film capacitor with a first electrode and a second electrode that are interdigitated with each other, in accordance with an embodiment.

Referring now to FIG. 5C, a cross-sectional illustration of a capacitor 530 with interdigitated first and second electrodes is shown, in accordance with an embodiment. In an embodiment, the first electrode 515 and the second electrode 516 may each comprise protrusions 513 that are interdigitated with each other. The protrusions provide additional surface area without increasing the footprint of the capacitor 530. Accordingly, the capacitance density is increased. While a single layer of interdigitated electrodes are shown, it is to be appreciated that a stack of any number of interdigitated electrodes separated by amorphous high-k dielectric layers 530 may be used in accordance with embodiments. Additionally, while no intermediate metal is shown in FIG. 5C, it is to be appreciated that intermediate metals may be used to separate the amorphous high-k dielectric layer 520 from the first electrode 515 and the second electrode 516.

Referring now to FIGS. 6A-6H, a series of cross-sectional illustrations showing a process for forming a thin film capacitor in a build-up layer is shown, in accordance with an embodiment.

Figure 6A:
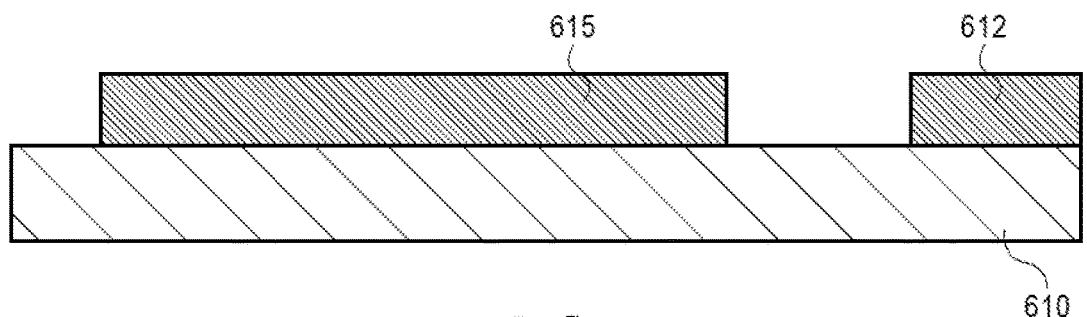
FIG. 6A is a cross-sectional illustration of a first electrode formed over a build-up layer, in accordance with an embodiment.

Referring now to FIG. 6A, a cross-sectional illustration after a first electrode 615 is formed over a build-up layer dielectric 610 is shown, in accordance with an embodiment. In an embodiment, the first electrode 615 may be formed at the same time as other conductive traces 612 are formed over the build-up layer dielectric 610. Accordingly, in some embodiments, the first electrode 615 may have a thickness that is substantially equal to a thickness of the conductive traces 612. In an embodiment, the first electrode 615 may be fabricated with any suitable process, such as a semi-additive plating (SAP) process, or the like.

Figure 6B:
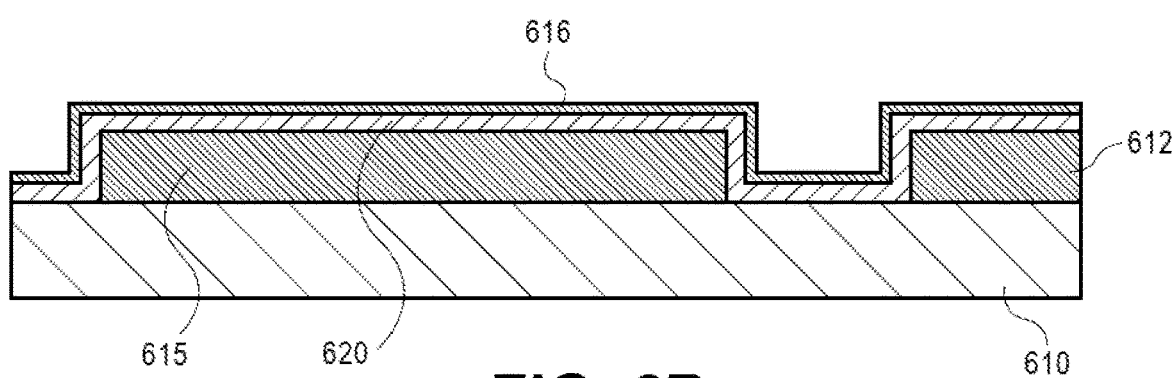
FIG. 6B is a cross-sectional illustration after a dielectric layer and a second electrode are disposed over the first electrode, in accordance with an embodiment.

Referring now to FIG. 6B, a cross-sectional illustration after a capacitor stack is blanket deposited over the first electrode 615 is shown, in accordance with an embodiment. In an embodiment, the capacitor stack may comprise an amorphous high-k dielectric layer 620 and a second electrode 616. In an additional embodiment, intermediate metals (not shown) may also be blanket deposited between the first electrode 615 and the dielectric layer 620, and between the dielectric layer 620 and the second electrode 616.

In an embodiment, the amorphous high-k dielectric layer 620 may be deposited with any suitable process. For example, the high-k dielectric layer 620 may be deposited with a sputtering process, a physical vapor deposition (PVD) process, a chemical vapor deposition (CVD) process, or the like. In an embodiment, the amorphous high-k dielectric layer 620 may have a thickness that is less than 5 μm, less than 2 μm, or less than 50 nm. In an embodiment, the second electrode 616 may have a thickness that is less than 10 μm, less than 5 μm, or less than 2 μm.

Figure 6C:
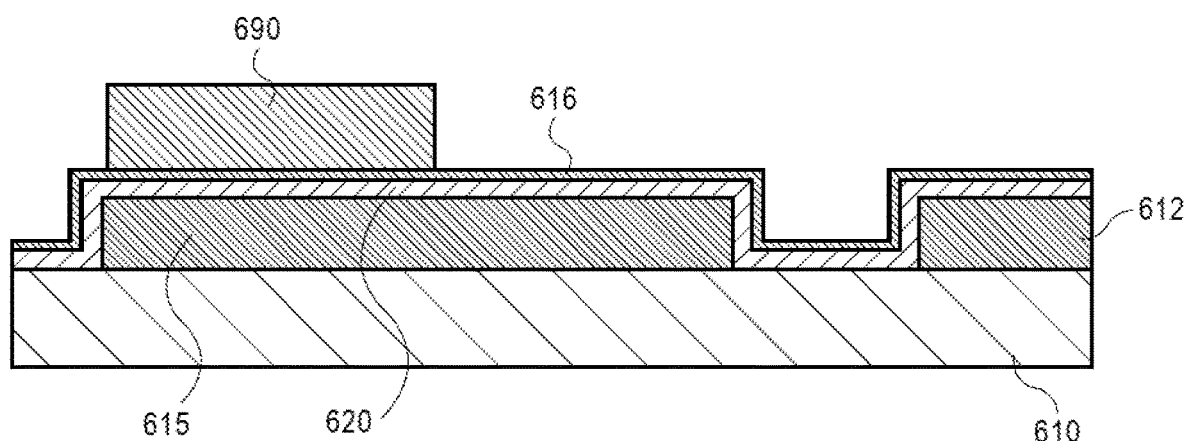
FIG. 6C is a cross-sectional illustration after a photoresist layer is patterned to expose portions of the second electrode, in accordance with an embodiment.

Referring now to FIG. 6C, a cross-sectional illustration after a masking layer is deposited and patterned to define the capacitor is shown, in accordance with an embodiment. In an embodiment, the masking layer 690 may be any suitable masking material, such as a photoresist or the like.

Figure 6D:
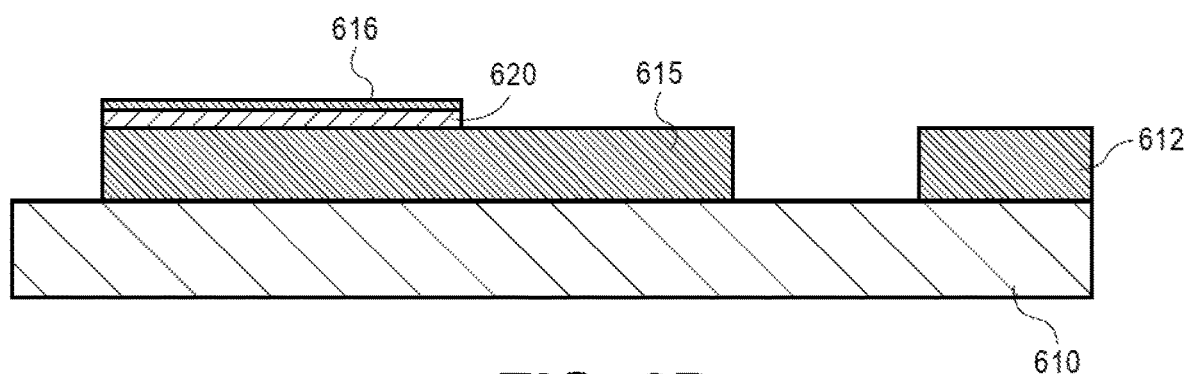
FIG. 6D is a cross-sectional illustration after the exposed portions of the second electrode and the underlying portions of the dielectric layer are removed, in accordance with an embodiment.

Referring now to FIG. 6D, a cross-sectional illustration after the portions of the second electrode 616 and the amorphous high-k dielectric layer 620 not covered by the masking layer 690 are removed is shown, in accordance with an embodiment. In an embodiment, one or more etching processes may be used to remove the exposed portions of the second electrode 616 and the amorphous high-k dielectric layer 620. Additional embodiments may also include suitable etching processes to remove any other metal layers (not shown) between the layers used to form the electrodes and the amorphous high-k dielectric layer 620.

Figure 6E:
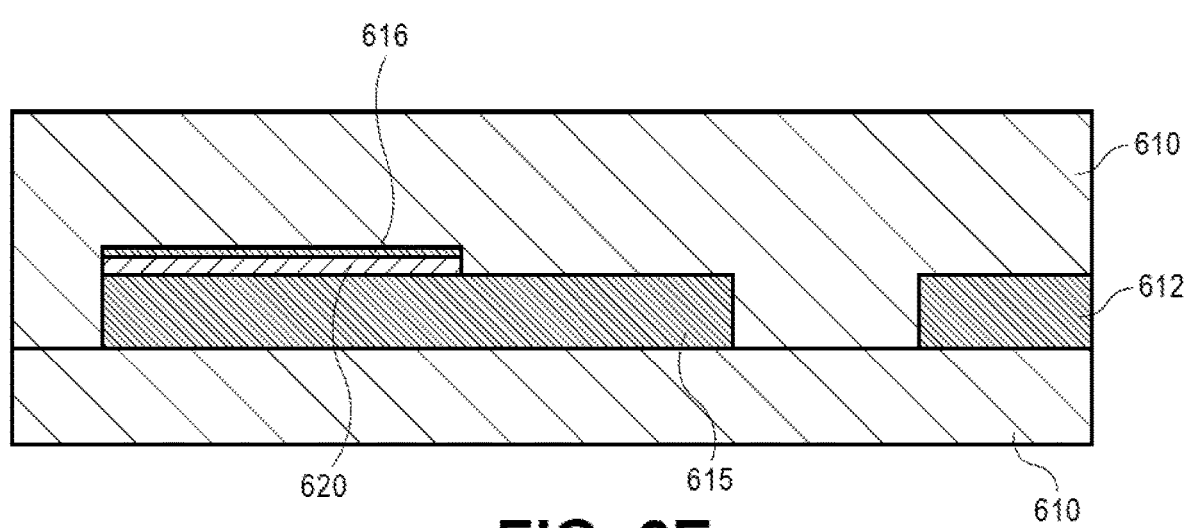
FIG. 6E is a cross-sectional illustration after a second build-up layer is disposed over the second electrode, in accordance with an embodiment.

Referring now to FIG. 6E, a cross-sectional illustration after a second build-up layer dielectric is formed over the capacitor is shown, in accordance with an embodiment. In an embodiment, the second build-up layer dielectric 610 may be formed with any suitable process, such as a lamination process, or the like.

Figure 6F:
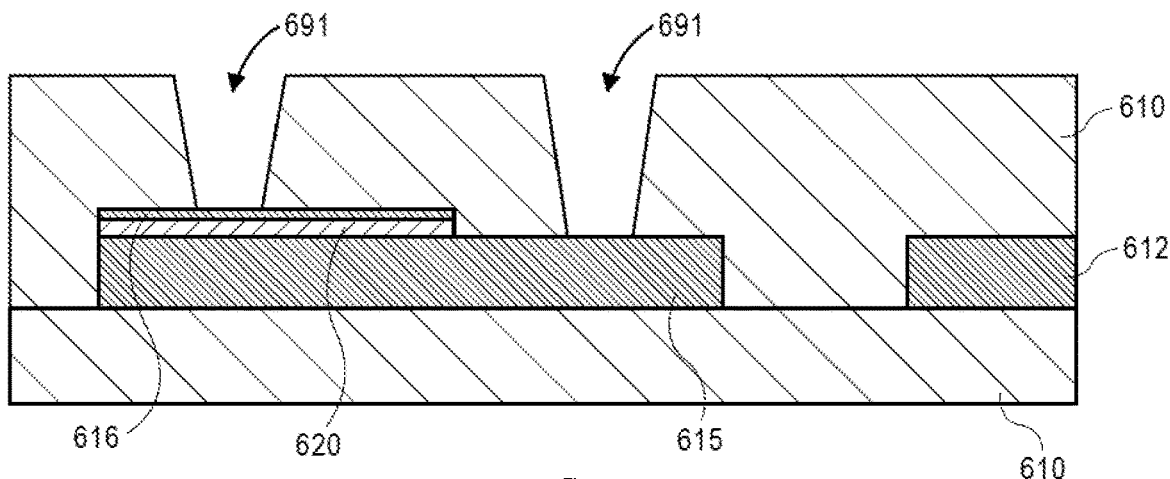
FIG. 6F is a cross-sectional illustration after via openings are formed in the second build-up layer in order to expose portions of the first electrode and the second electrode, in accordance with an embodiment.

Referring now to FIG. 6F, a cross-sectional illustration after via openings are formed into the second build-up layer dielectric is shown, in accordance with an embodiment. In an embodiment, the via openings 691 may be formed with any suitable process, such as a laser drilling process, a lithographic process, or the like. In an embodiment, the via openings 691 expose portions of the first electrode 615 and the second electrode 616. However, it is to be appreciated that the first electrode 615 may also be contacted from below, and therefore may not require a via opening formed into the second build-up layer dielectric 610.

Figure 6G:
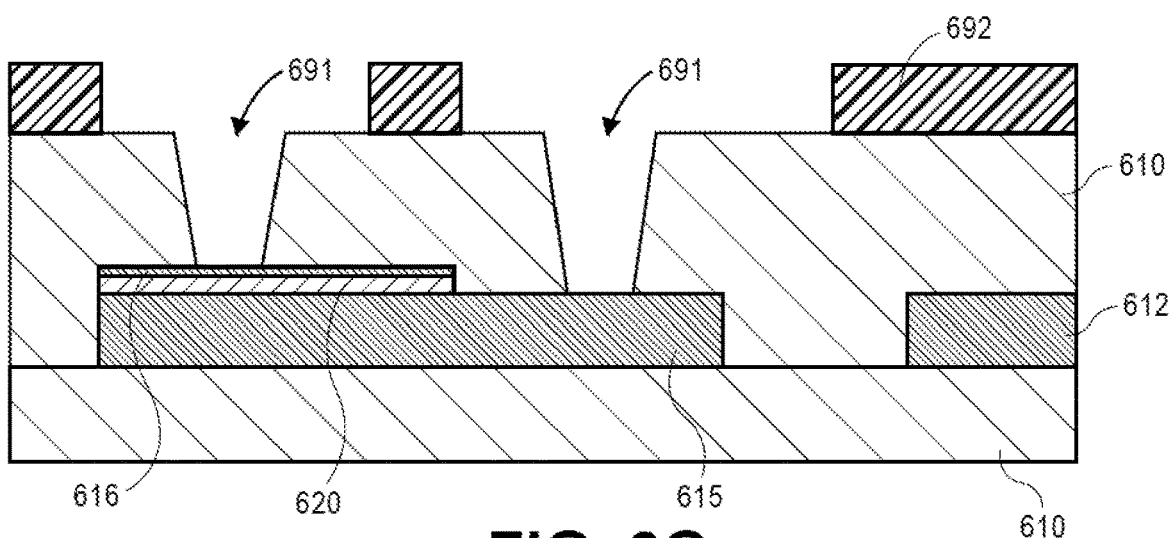
FIG. 6G is a cross-sectional illustration after a second photoresist is patterned over the second build-up layer, in accordance with an embodiment.

Referring now to FIG. 6G, a cross-sectional illustration after the pattern for the subsequent metal layer is formed is shown, in accordance with an embodiment. In an embodiment, the pattern for subsequent metal layer may be formed with a second masking layer 692. For example, the second masking layer 692 may be a photoresist material, or like. While not shown in FIG. 6G, it is to be appreciated that a seed layer may be formed over surfaces of the second build-up layer dielectric 610 prior to forming the masking layer 692 (as is known in the art).

Figure 6H:
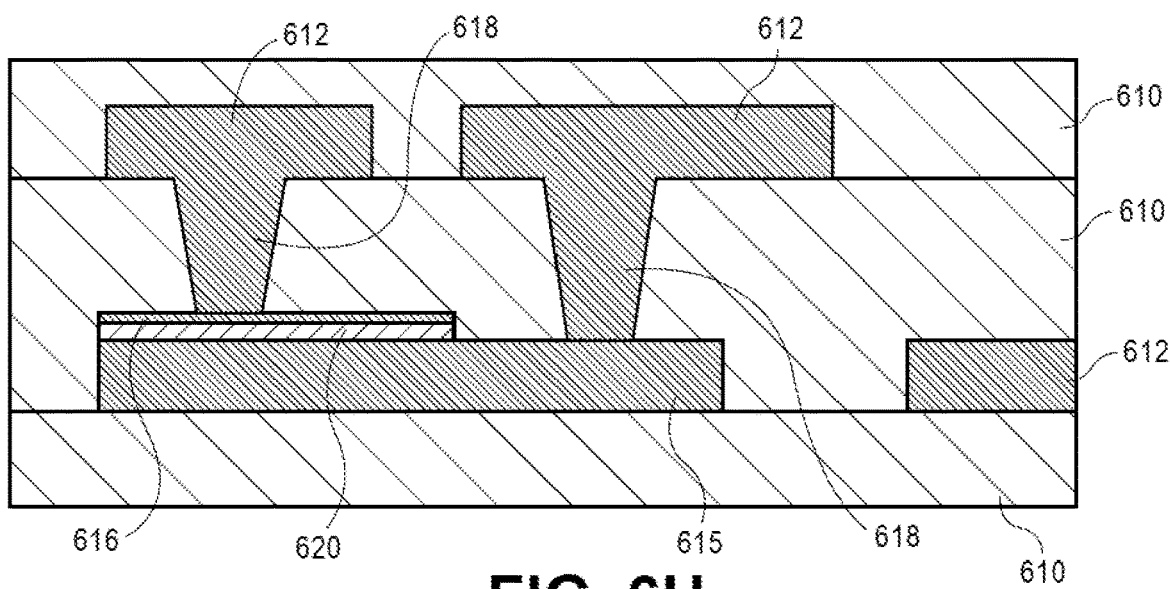
FIG. 6H is a cross-sectional illustration after vias and traces are formed to provide electrical connections to the first and second electrodes of the capacitor, in accordance with an embodiment.

Referring now to FIG. 6H, a cross-sectional illustration after subsequent processing forms the next metal layer and vias is shown, in accordance with an embodiment. In an embodiment, the vias 618 and subsequent metal layers 612 may be formed with any suitable process such as an SAP process or the like. In an embodiment, another build-up layer dielectric 610 may be formed over the traces 612 after the seed layer is removed.

Referring now to FIGS. 7A-7G, a series of cross-sectional illustrations show a process for forming a capacitor with a plurality of stacked amorphous high-k dielectric layers is shown, in accordance with an embodiment.

Figure 7A:
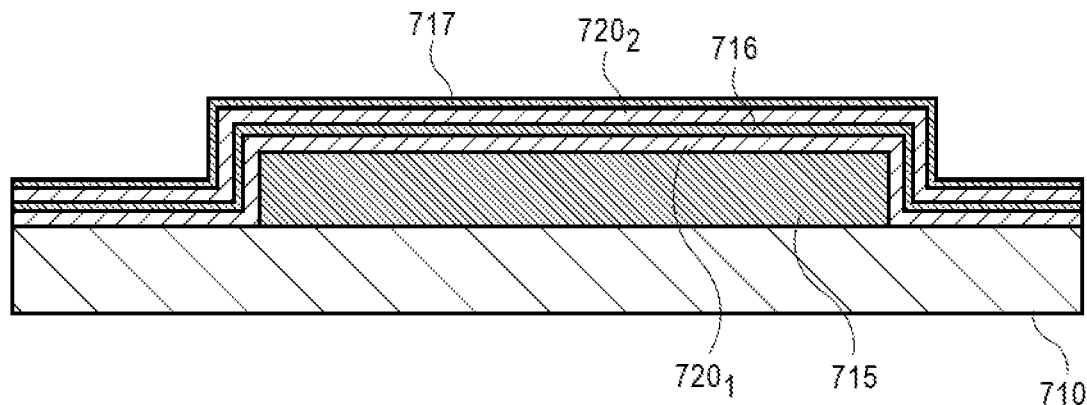
FIG. 7A is a cross-sectional illustration of a first electrode after a first dielectric layer, a second electrode, a second dielectric layer, and a third electrode are disposed over the first electrode, in accordance with an embodiment.

Referring now to FIG. 7A, a cross-sectional illustration of a first electrode 715 and a capacitor stack formed over the first electrode 715 is shown, in accordance with an embodiment. In an embodiment, the capacitor stack may comprise a first amorphous high-k dielectric layer $720_1$, a second amorphous high-k dielectric layer $720_2$, a second electrode 716 between the first amorphous high-k dielectric layer $720_1$ and the second amorphous high-k dielectric layer $720_2$, and a third electrode 717 over the second amorphous high-k dielectric layer $720_2$. In an additional embodiment, intermediate metals (not shown) may also be blanket deposited between the electrodes and the amorphous high-k dielectric layers 720.

In an embodiment, the amorphous high-k dielectric layers 720 may be deposited with any suitable process. For example, the high-k dielectric layers 720 may be deposited with a sputtering process, a PVD process, a CVD process, or the like. In an embodiment, the amorphous high-k dielectric layers 720 may have a thickness that is less than 5 μm, less than 2 μm, or less than 50 nm. In an embodiment, the second electrode 716 and third electrode 717 may have thicknesses that are less than 10 μm, less than 5 μm, or less than 2 μm.

Figure 7B:
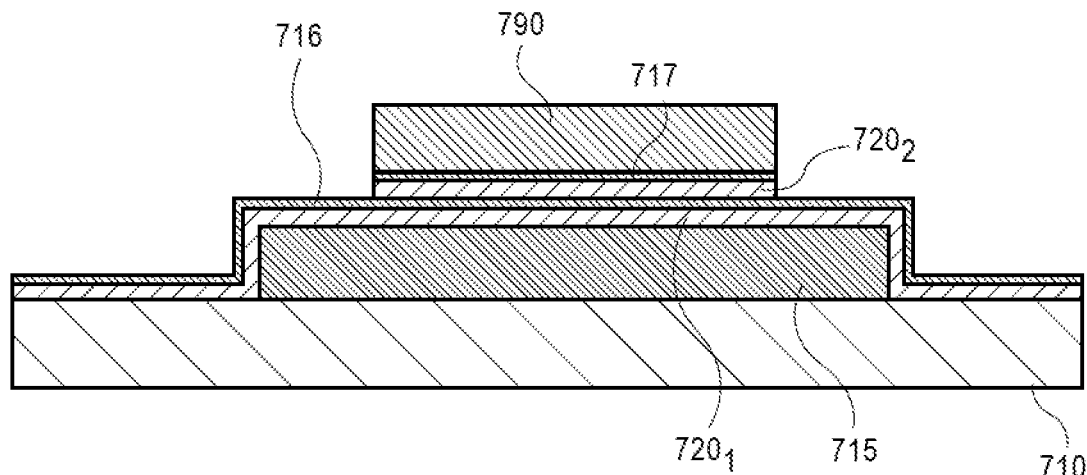
FIG. 7B is a cross-sectional illustration after a first photoresist layer is patterned and the third electrode and the second dielectric layers are etched, in accordance with an embodiment.

Referring now to FIG. 7B, a cross-sectional illustration after a first masking layer is patterned over the capacitor stack is shown, in accordance with an embodiment. In an embodiment the first masking layer 790 may be used to define the second amorphous high-k dielectric layer $720_2$ and the third electrode 717. For example, the exposed portions of the third electrode 717 and the second amorphous high-k dielectric layer $720_2$ may be removed with one or more etching processes or the like. Additional embodiments may also include suitable etching processes to remove any other metal layers (not shown) between the layers used to form the electrodes and the amorphous high-k dielectric layers.

Figure 7C:
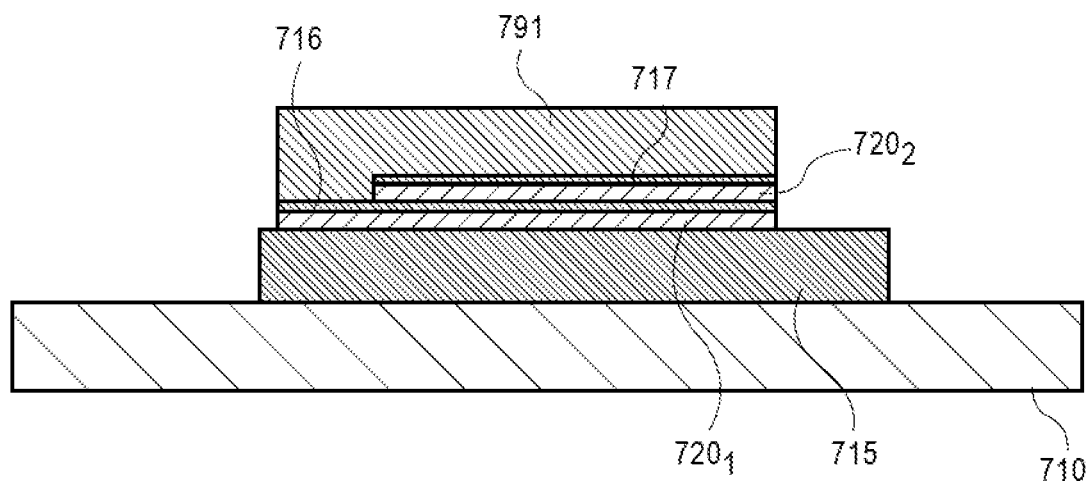
FIG. 7C is a cross-sectional illustration after a second photoresist layer is patterned and the first dielectric layer and the second electrode are etched, in accordance with an embodiment.

Referring now to FIG. 7C, a cross-sectional illustration after a second masking layer is patterned over the capacitor stack is shown, in accordance with an embodiment. In an embodiment the second masking layer 791 may be used to define the first amorphous high-k dielectric layer $720_1$ and the second electrode 716. For example, the exposed portions of the second electrode 716 and the first amorphous high-k dielectric layer $720_1$ may be removed with one or more etching processes or the like.

Figure 7D:
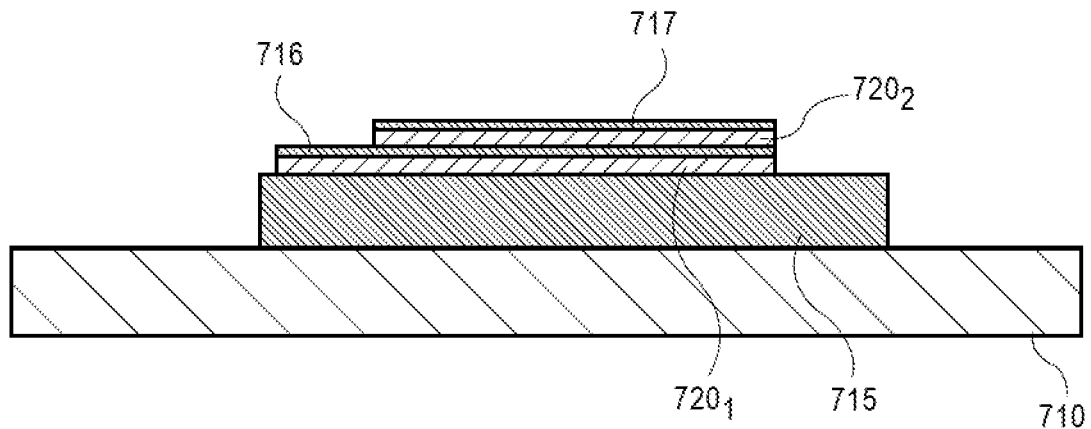
FIG. 7D is a cross-sectional illustration after the second photoresist layer is removed to expose a capacitor with multiple dielectric layers, in accordance with an embodiment.

Referring now to FIG. 7D, a cross-sectional illustration after the second masking layer 791 is removed is shown, in accordance with an embodiment. In an embodiment, the second masking layer 791 may be removed with an ashing process or the like.

Figure 7E:
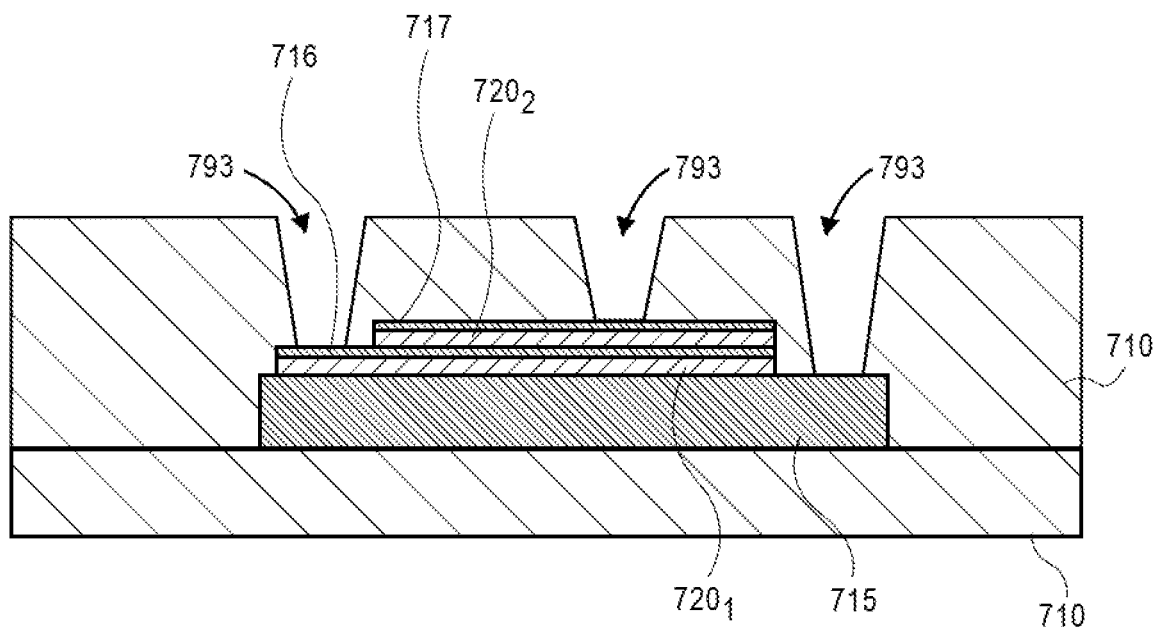
FIG. 7E is a cross-sectional illustration after a second build-up layer is formed over the capacitor and the second build-up layer is patterned to form via openings to the first electrode, the second electrode, and the third electrode, in accordance with an embodiment.

Referring now to FIG. 7E, a cross-sectional illustration after a second build-up layer dielectric 710 is formed over the capacitor and is patterned to form via openings 793 to expose the first electrode 715, the second electrode 716, and the third electrode 717 is shown in accordance with an embodiment. In an embodiment, the second build-up layer dielectric 710 may be formed with a lamination process or the like. In an embodiment, the via openings may be formed with any suitable process, such as a laser drilling process, a lithography process, or the like.

Figure 7F:
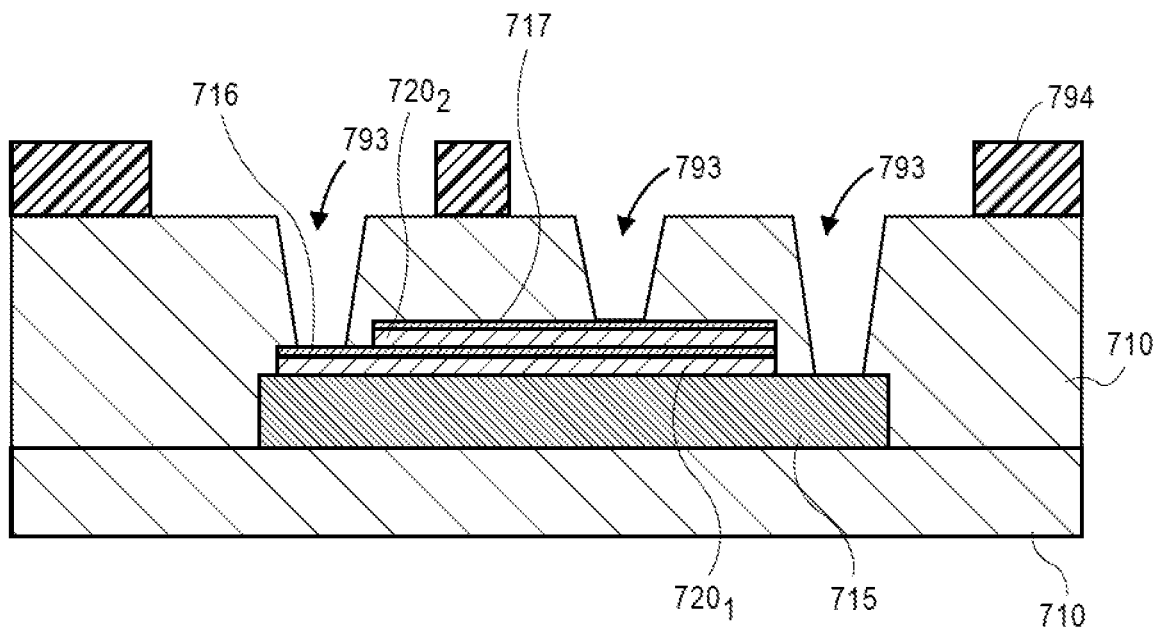
FIG. 7F is a cross-sectional illustration after a third photoresist layer is patterned over the second build-up layer, in accordance with an embodiment.

Referring now to FIG. 7F, a cross-sectional illustration after the pattern for the subsequent metal layer is formed is shown, in accordance with an embodiment. In an embodiment, the pattern for subsequent metal layer may be formed with a third masking layer 794. For example, the third masking layer 794 may be a photoresist material, or like. While not shown in FIG. 7F, it is to be appreciated that a seed layer may be formed over surfaces of the second build-up layer dielectric 710 prior to forming the masking layer 794 (as is known in the art).

Figure 7G:
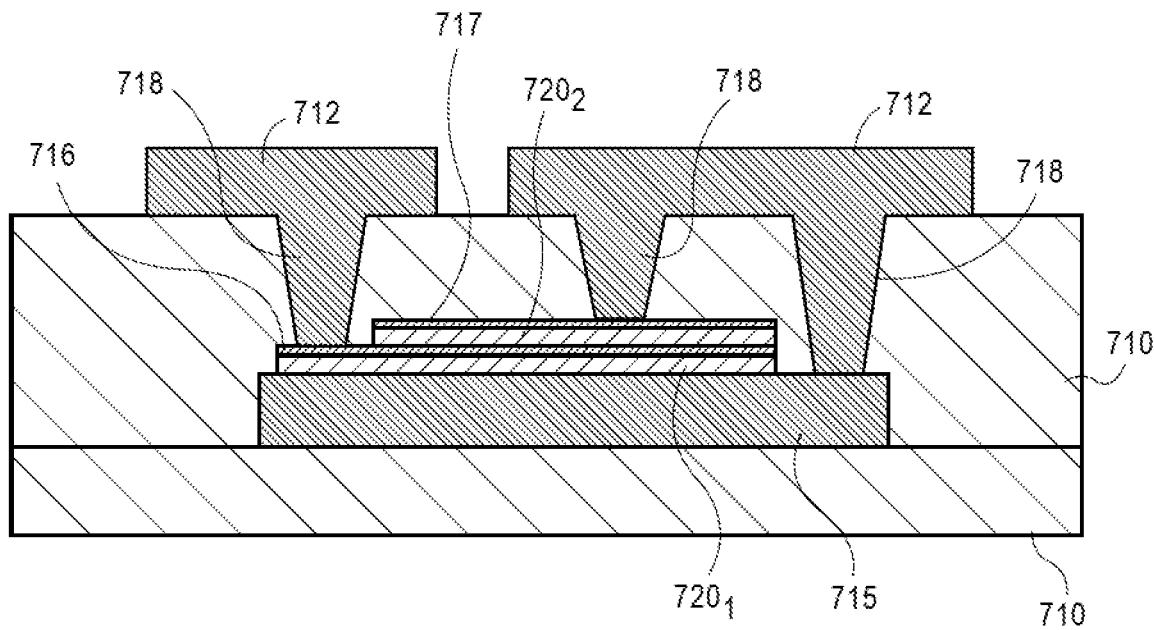
FIG. 7G is a cross-sectional illustration after vias are formed to provide contacts to the first electrode, the second electrode and the third electrode, in accordance with an embodiment.

Referring now to FIG. 7G, a cross-sectional illustration after subsequent processing forms the next metal layer and vias is shown, in accordance with an embodiment. In an embodiment, the vias 718 and subsequent metal layers 712 may be formed with any suitable process such as an SAP process or the like. In an embodiment, another build-up layer dielectric (not shown) may be formed over the traces 712 after the seed layer is removed.

Figure 8:
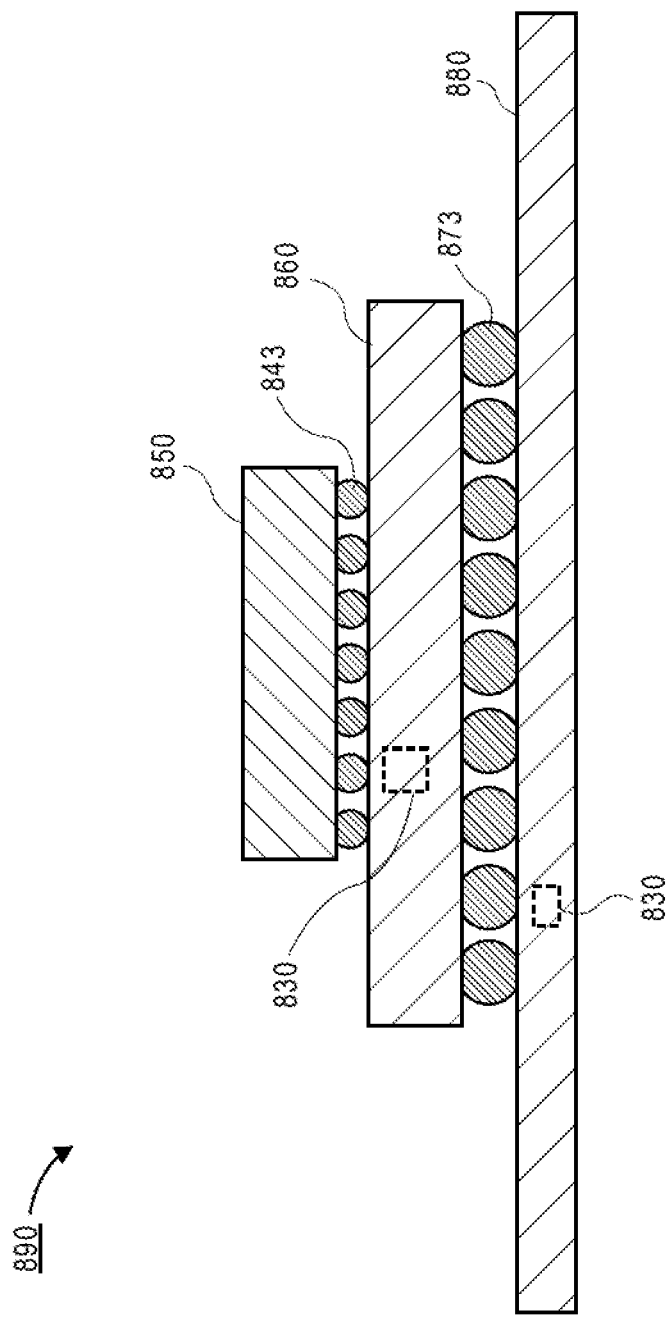
FIG. 8 is a cross-sectional illustration of an electronic package that includes a thin film capacitor, in accordance with an embodiment.

Referring now to FIG. 8, a cross-sectional illustration of a packaged system 890 is shown, in accordance with an embodiment. In an embodiment, the packaged system 890 may include a die 850 electrically coupled to a package substrate 860 with solder bumps 843. In additional embodiments, the die 850 may be electrically coupled to the package substrate 860 with any suitable interconnect architecture, such as wire bonding or the like. The package substrate 860 may be electrically coupled to a board, such as a printed circuit board (PCB) 880 with solder bumps 873 or any other suitable interconnect architecture, such as wire bonding or the like.

In an embodiment, a thin film capacitor 830 with an amorphous high-k dielectric similar to embodiments described above may be integrated into the package substrate 860 or the board 880, or the package substrate 860 and the board 880. Embodiments include any number of thin film capacitors 830 with an amorphous high-k dielectric formed into the package substrate 860 and the board 880. For example, a plurality of thin film capacitors 830 with an amorphous high-k dielectric may be integrated into the package substrate 860 or the board 880, or the package substrate 860 and the board 880.

Figure 9:
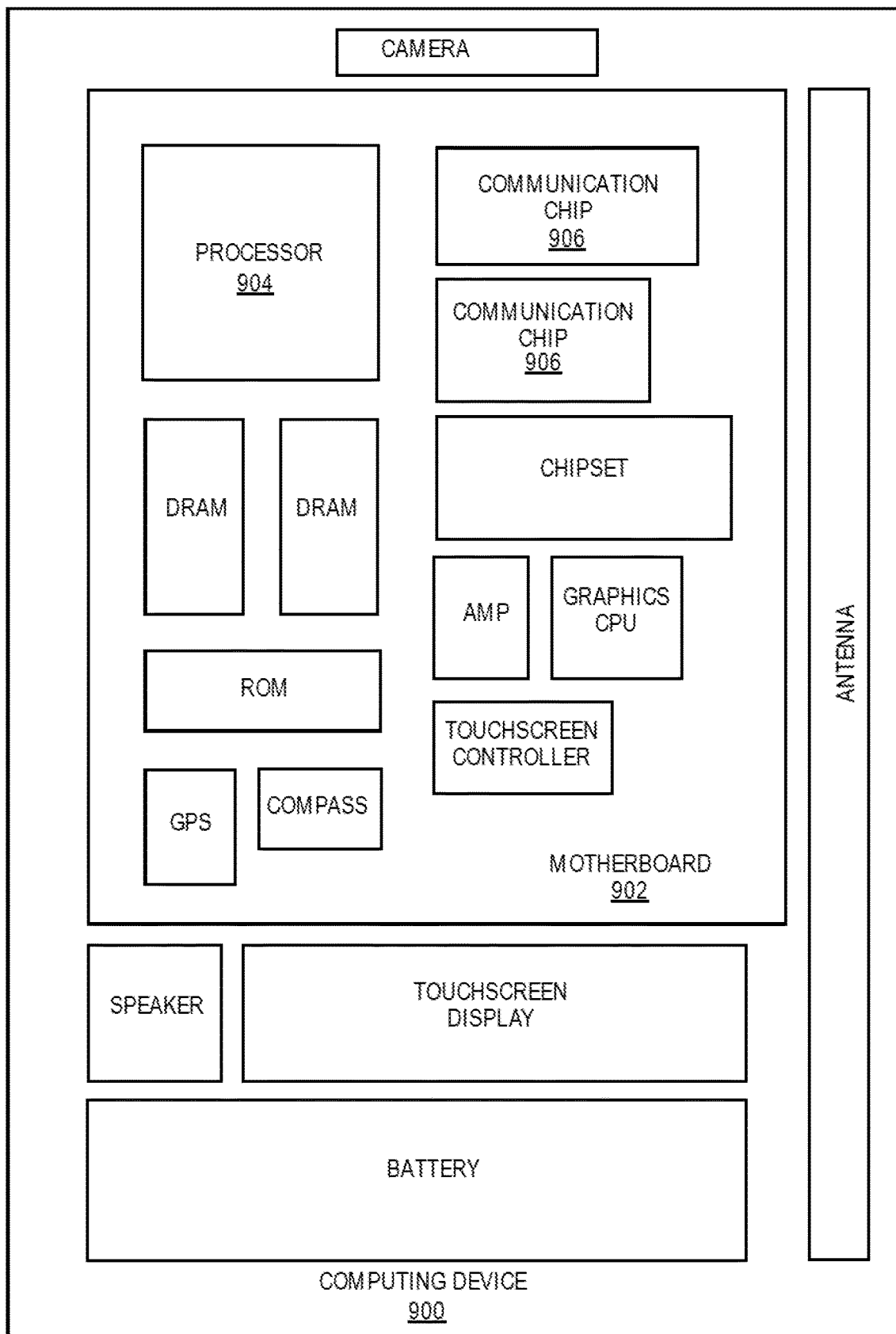
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be communicatively coupled to an organic electronic package that includes thin film capacitors with an amorphous high-k dielectric, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be communicatively coupled to an organic electronic package that includes thin film capacitors with an amorphous high-k dielectric, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: An electronic package, comprising: a dielectric layer; and a capacitor on the dielectric layer, wherein the capacitor comprises: a first electrode disposed over the dielectric layer; a capacitor dielectric layer over the first electrode, wherein the capacitor dielectric layer is an amorphous dielectric layer; and a second electrode over the capacitor dielectric layer.

Example 2: the electronic package of Example 1, wherein the capacitor dielectric layer is a high-k dielectric layer.

Example 3: the electronic package of Example 1 or Example 2, wherein the capacitor dielectric layer has a k-value that is 10 or greater.

Example 4: the electronic package of Examples 1-3, wherein the capacitor dielectric layer has a k-value that is 100 or greater.

Example 5: the electronic package of Examples 1-4, wherein the capacitor dielectric layer has a thickness that is less than 2 μm.

Example 6: the electronic package of Examples 1-5, wherein the capacitor dielectric layer has a thickness that is less than 50 nm.

Example 7: the electronic package of Examples 1-6, wherein the capacitor further comprises a first intermediate metal layer between the first electrode and the capacitor dielectric layer, and a second intermediate metal layer between the capacitor dielectric layer and the second electrode.

Example 8: the electronic package of Examples 1-7, wherein the capacitor dielectric layer is $TiO_2$, and wherein the first and second intermediate metal layers comprise titanium.

Example 9: the electronic package of Examples 1-8, wherein the first and second intermediate metal layers comprise titanium and nitrogen.

Example 10: the electronic package of Examples 1-9, wherein the capacitor further comprises a second capacitor dielectric over the second electrode, and a third electrode over the second capacitor dielectric, wherein the second capacitor dielectric is an amorphous dielectric layer.

Example 11: the electronic package of Examples 1-10, wherein the capacitor has a thickness that is less than 10 μm.

Example 12: the electronic package of Examples 1-11, wherein the capacitor is disposed entirely within a second dielectric layer formed over the first dielectric layer.

Example 13: the electronic package of Examples 1-12, wherein the first electrode and the second electrode comprise interdigitated portions.

Example 14: an electronics system comprising: a package substrate; a die electrically and mechanically coupled to the package substrate; and a plurality of capacitors in the package substrate, wherein each of the plurality of capacitors comprises an amorphous dielectric layer.

Example 15: the electronics system of Example 14, wherein one or more of the plurality of capacitors are formed in a build-up layer of the package substrate closest to the die.

Example 16: the electronics system of Example 14 or Example 15, wherein the plurality of capacitors are formed in more than one build-up layer of the package substrate.

Example 17: the electronics system of Examples 14-16, wherein the package substrate comprises a core, and first build-up layers over a first surface of the core, and second build-up layers over a second surface of the core.

Example 18: the electronics system of Examples 14-17, wherein the plurality of capacitors are formed in the first build-up layers, wherein the first build-up layers are closer to the die than the second build-up layers.

Example 19: the electronics system of Examples 14-18, wherein the plurality of capacitors are formed in the first build-up layers and the second build-up layers.

Example 20: the electronics system of Examples 14-19, wherein each of the plurality of capacitors are disposed in a single build-up layer of the package substrate.

Example 21: the electronics system of Examples 14-20, wherein the dielectric layer of each of the plurality of capacitors has a k-value greater than 10.

Example 22: the electronics system of Examples 14-21, wherein one or more of the plurality of capacitors comprises a first amorphous dielectric layer and a second amorphous dielectric layer.

Example 23: a method of forming a capacitor in a build-up layer, comprising: disposing a first electrode on a first dielectric layer; disposing an amorphous dielectric layer over the first electrode, wherein the amorphous dielectric layer has a thickness that is less than 50 nm and a k-value that is 10 or greater; disposing a second electrode over the amorphous dielectric layer; and disposing a second dielectric layer over the first dielectric layer.

Example 24: the method of Example 23, further comprising: disposing a first intermediate metal between the first electrode and the amorphous dielectric layer; and disposing a second intermediate metal between the amorphous dielectric layer and the second electrode.

Example 25: the method of Example 23 or Example 24, wherein the amorphous dielectric layer is $TiO_2$, and wherein the first and second intermediate metals comprise titanium.

What is claimed is:

1. An electronics package, comprising:
   a build-up layer dielectric; and
   a capacitor structure above the build-up layer dielectric, the capacitor structure comprising:
     a first electrode having a plurality of upward facing protrusions;
     an amorphous dielectric layer above and conformal with the first electrode; and
     a second electrode above the amorphous dielectric, the second electrode having a plurality of downward facing protrusions interdigitated with the plurality of upward facing protrusions of the first electrode, wherein the downward facing protrusions and the upward facing protrusions have sloped sidewalls.

2. The electronics package of claim 1, wherein the second electrode has a planar uppermost surface.

3. The electronics package of claim 1, wherein the first electrode has a planar lowermost surface.

4. The electronic package of claim 1, further comprising:
   a first conductive via above and coupled to the first electrode; and
   a second conductive via above and coupled to the second electrode, wherein the first via extends below the second via.

5. The electronics package of claim 1, further comprising:
   a metal layer between the first electrode and the amorphous dielectric layer.

6. The electronics package of claim 1, further comprising:
   a metal layer between the second electrode and the amorphous dielectric layer.

7. The electronics package of claim 1, further comprising:
   a first metal layer between the second electrode and the amorphous dielectric layer; and
   a second metal layer between the second electrode and the amorphous dielectric layer.

8. The electronics package of claim 1, further comprising:
   a second build-up layer dielectric above the capacitor structure.

9. The electronics package of claim 8, further comprising:
   a third build-up layer dielectric between the first build-up layer dielectric and the second build-up layer dielectric, wherein the capacitor structure is in the third build-up layer dielectric.

10. An electronics package, comprising:
    a build-up layer dielectric; and
    a capacitor structure in the build-up layer dielectric, the capacitor structure comprising:
      a first electrode having a plurality of upward facing protrusions;
      an amorphous dielectric layer above and conformal with the first electrode; and
      a second electrode above the amorphous dielectric, the second electrode having a plurality of downward facing protrusions interdigitated with the plurality of upward facing protrusions of the first electrode, wherein the downward facing protrusions and the upward facing protrusions have sloped sidewalls.

11. The electronics package of claim 10, wherein the second electrode has a planar uppermost surface.

12. The electronics package of claim 10, wherein the first electrode has a planar lowermost surface.

13. The electronic package of claim 10, further comprising:
    a first conductive via above and coupled to the first electrode; and
    a second conductive via above and coupled to the second electrode, wherein the first via extends below the second via.

14. The electronics package of claim 10, further comprising:
    a metal layer between the first electrode and the amorphous dielectric layer.

15. The electronics package of claim 10, further comprising:
    a metal layer between the second electrode and the amorphous dielectric layer.

16. The electronics package of claim 10, further comprising:
    a first metal layer between the second electrode and the amorphous dielectric layer
    a second metal layer between the second electrode and the amorphous dielectric layer.

17. The electronics package of claim 10, further comprising:
    a second build-up layer dielectric above the capacitor structure.

18. The electronics package of claim 10, further comprising:
    a second build-up layer dielectric below the capacitor structure.

19. An electronics package, comprising:
    a build-up layer dielectric; and
    a capacitor structure above or in the build-up layer dielectric, the capacitor structure comprising:
      a first electrode having a plurality of upward facing protrusions;
      an amorphous dielectric layer above and conformal with the first electrode;

a second electrode above the amorphous dielectric, the second electrode having a plurality of downward facing protrusions interdigitated with the plurality of upward facing protrusions of the first electrode, and wherein the capacitor structure further comprises a metal layer between the first electrode and the amorphous dielectric layer, or a metal layer between the second electrode and the amorphous dielectric layer, or a first metal layer between the second electrode and the amorphous dielectric layer and a second metal layer between the second electrode and the amorphous dielectric layer.

20. The electronics package of claim 19, wherein the capacitor structure is above the build-up layer dielectric, and wherein the capacitor structure comprises the metal layer between the first electrode and the amorphous dielectric layer.

21. The electronics package of claim 19, wherein the capacitor structure is above the build-up layer dielectric, and wherein the capacitor structure comprises the metal layer between the second electrode and the amorphous dielectric layer.

22. The electronics package of claim 19, wherein the capacitor structure is above the build-up layer dielectric, and wherein the capacitor structure comprises the first metal layer between the second electrode and the amorphous dielectric layer, and the second metal layer between the second electrode and the amorphous dielectric layer.

23. The electronics package of claim 19, wherein the capacitor structure is in the build-up layer dielectric, and wherein the capacitor structure comprises the metal layer between the first electrode and the amorphous dielectric layer.

24. The electronics package of claim 19, wherein the capacitor structure is in the build-up layer dielectric, and wherein the capacitor structure comprises the metal layer between the second electrode and the amorphous dielectric layer.

25. The electronics package of claim 19, wherein the capacitor structure is in the build-up layer dielectric, and wherein the capacitor structure comprises the first metal layer between the second electrode and the amorphous dielectric layer, and the second metal layer between the second electrode and the amorphous dielectric layer.

* * * * *